US008384157B2

(12) United States Patent
Morini

(10) Patent No.: US 8,384,157 B2
(45) Date of Patent: Feb. 26, 2013

(54) HIGH OHMIC INTEGRATED RESISTOR WITH IMPROVED LINEARITY

(75) Inventor: Sergio Morini, Pavia (IT)

(73) Assignee: International Rectifier Corporation, El Segundo, CA (US)

( * ) Notice: Subject to any disclaimer, the term of this patent is extended or adjusted under 35 U.S.C. 154(b) by 651 days.

(21) Appl. No.: 11/746,949

(22) Filed: May 10, 2007

(65) Prior Publication Data

US 2008/0278213 A1 Nov. 13, 2008

(51) Int. Cl.
*H01L 27/12* (2006.01)
(52) U.S. Cl. .............. 257/350; 257/359; 257/529
(58) Field of Classification Search ............. 257/359, 257/350, 529
See application file for complete search history.

(56) References Cited

U.S. PATENT DOCUMENTS

| | | | | |
|---|---|---|---|---|
| 3,430,110 A | * | 2/1969 | Goshgarian | 257/536 |
| 3,929,512 A | | 12/1975 | Nicholas et al. | |
| 4,024,417 A | * | 5/1977 | Heuber et al. | 327/565 |
| 4,161,742 A | * | 7/1979 | Kane | 257/540 |
| 4,164,668 A | * | 8/1979 | Delaporte et al. | 327/564 |
| 4,212,025 A | * | 7/1980 | Hirasawa et al. | 257/379 |
| 4,309,626 A | * | 1/1982 | Kudo | 327/564 |
| 4,423,433 A | * | 12/1983 | Imaizumi et al. | 257/488 |
| 4,466,013 A | | 8/1984 | van de Plassche et al. | |
| 4,609,935 A | * | 9/1986 | Kondo | 257/536 |
| 4,622,856 A | * | 11/1986 | Binder et al. | 73/727 |
| 4,937,639 A | * | 6/1990 | Yao et al. | 257/360 |
| 5,111,068 A | * | 5/1992 | Kusakabe | 327/565 |
| 5,296,726 A | | 3/1994 | MacElwee | |
| 5,315,149 A | * | 5/1994 | Compagne | 257/536 |
| 5,416,357 A | * | 5/1995 | Kobayashi et al. | 257/536 |
| 6,165,861 A | * | 12/2000 | Liu et al. | 438/382 |
| 6,441,460 B1 | | 8/2002 | Viebach | |
| 6,667,523 B2 | | 12/2003 | Woodbury et al. | |
| 7,615,824 B2 | * | 11/2009 | Koyama et al. | 257/350 |
| 2003/0062593 A1 | * | 4/2003 | Lakshmikumar | 257/529 |
| 2008/0169507 A1 | * | 7/2008 | Nowak et al. | 257/350 |

FOREIGN PATENT DOCUMENTS

| | | |
|---|---|---|
| GB | 1517266 | 7/1978 |
| JP | 5175429 | 7/1993 |

* cited by examiner

*Primary Examiner* — David Vu
*Assistant Examiner* — Caleb Henry
(74) *Attorney, Agent, or Firm* — Farjami & Farjami LLP

(57) ABSTRACT

An integrated circuit that includes a resistor module with improved linearity is disclosed. The resistor module includes a diffused resistor body of a first conductivity type; a first terminal and a second terminal, each making direct electrical contact with the diffused resistor body; a doped well of a second conductivity type substantially surrounding the diffused resistor body on all but one major surface of the diffused resistor body, the doped well having contact regions; a first amplifier connected to the first terminal and to one contact region of the doped well; and a second amplifier connected to the second terminal and to another contact region of the well, such that the first amplifier and the second amplifier are connected for power supply only to the first terminal and second terminal, respectively. The first and second amplifiers may be unity gain buffer amplifiers or inverting opamps.

17 Claims, 5 Drawing Sheets

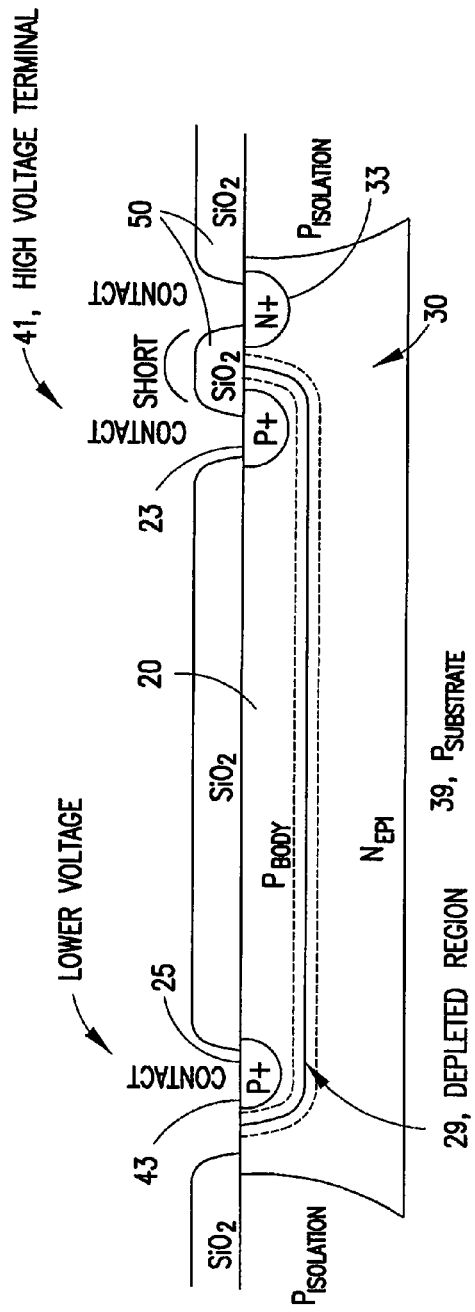
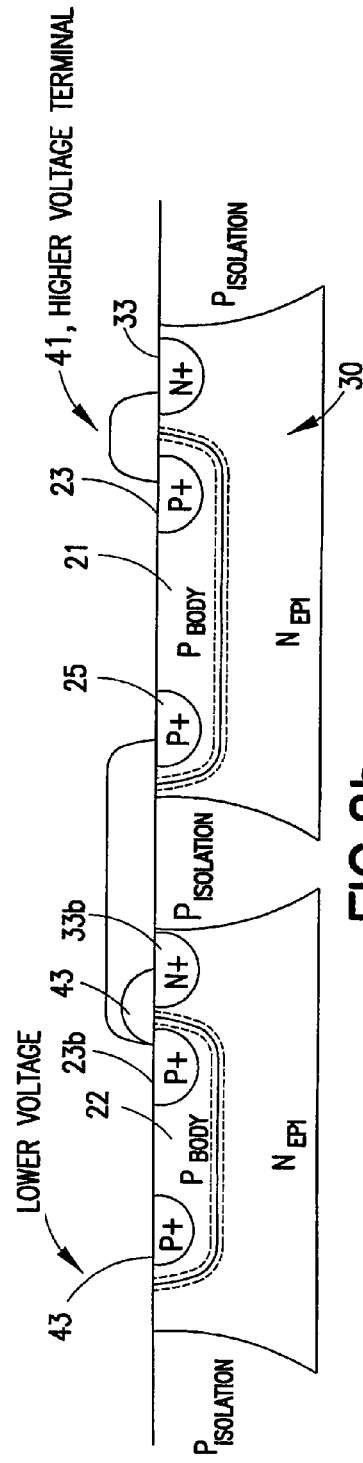
FIG. 2a
FIG. 2b

☐ METAL 1
▨ METAL 2
☒ CONTACT

HIGH OHMIC INTEGRATED RESISTOR WITH IMPROVED LINEARITY

CROSS REFERENCE TO RELATED APPLICATION

The present application claims the benefit and priority of U.S. Provisional Application Ser. No. 60/779,301 filed May 10, 2006 and entitled HIGH OHMIC INTEGRATED RESISTORS WITH IMPROVED LINEARITY, the entire disclosure of which is incorporated by reference herein.

FIELD OF THE INVENTION

The present invention relates to integrated circuits with resistors, including diffused resistor body resistors and to resistors with biased wells around the resistor bodies.

BACKGROUND OF THE INVENTION

A number of electronic applications utilize resistors and analog integrated circuits that include such resistors are well known. Resistors are optimally linear devices, that is, the output is directly proportional to the input. However, achieving a highly linear resistor in an integrated circuit is difficult or expensive. There are two principal types of resistors available using integrated circuit technology but both have linearity problems.

A diffused resistor employs an N-type or P-body diffusion as a resistive layer or body. However, it is quite expensive to produce an integrated circuit with a diffused resistor body that is fully isolated by silicon oxide. Typically, electrical isolation of the resistor body from the surrounding silicon is obtained by reverse biasing the PN junction or parasitic diode where the diffusion body meets the silicon substrate. A problem with this reverse biasing approach is that the depletion region of the PN junction reduces the effective size of the diffusion resistor body. Further, the resistive value of the resistor (the effective thickness of the diffusion resistor body) varies as a function of different polarization conditions. That is, since the region depleted from freecharge does not contribute to conduction, the resistive value of a given resistor will vary with polarization. Thus, this type of resistor exhibits nonlinear behavior.

FIG. 1 shows a resistor portion 10 of an integrated circuit with isolated resistor modules 21 and 22. Each of the resistor modules 21 and 22 includes a more heavily doped contact region 23, 25, respectively, and terminals 41, 43 making direct electrical contact with the heavily doped contact regions 23, 25, respectively. Also, FIG. 1 shows the depletion region 29 of each of the resistor modules 21 and 22 formed at the PN junction where the resistor module is surrounded by the substrate 30. It will be understood that while FIG. 1 shows the resistor modules 21, 22 formed of N-type material, and the substrate 30 formed of P-type material, the resistor body may be P-type while the substrate may be N-type.

Yasushi, Japanese Patent Publication No. 05-175429, published Jul. 13, 1993, discloses an integrated circuit resistor element in which a resistor 20 is formed by P-type diffusion in an N-diffused island 21 surrounded with an isolating area 11, as illustrated in FIG. 7. A power supply 26 is connected to electrodes 22 and 23 of the resistor 20, such that the voltage on the electrodes 22 and 23 is also received by voltage followers 27 and 28 and such that DC power supplies 29 and 30 also provide current to electrodes 24 and 25 of the N-diffused island 21. Yasushi discloses that the DC power supply 29 and the DC power supply 30 are additionally connected to electrodes 24 and 25, respectively, of the island 21. Accordingly, Yasushi discloses that, when the voltage of electrode 22 of resistor 20 equals $V_{ra}$ and the voltage of the DC power supply 29 is $V_s$, the potential of electrode 24 will equal $V_{ra}+V_s$. Similarly, when the potential of electrode 23 equals $V_{rb}$, then the potential of electrode 25 will equal $V_{rb}+V_s$, and accordingly, the voltage drop across resistor 20 and the voltage drop across the N-diffused island 21 become equal, such that a constant reverse bias is applied in this state.

Thus, Yasushi discloses extra power supplies provided to each of electrodes 24 and 25 of N-diffused island 21 surrounding resistor 20 to maintain an equal voltage between the portions of N-diffused island 21 and resistor 20. Also, although the voltage drop disclosed by Yasushi is equal between terminals 22 and 23 of resistor 20 and terminals 24 and 25 of N-diffused island 21, the voltage $V_{ra}$ at electrode 22 of resistor 20 will not equal the voltage $V_{ra}+V_s$ at electrode 24 connected to N-diffused island 21, and similarly, the voltage $V_{rb}$ at electrode 23 of resistor 20 will not equal the voltage $V_{rb}+V_s$ at terminal 25 of N-diffused island 21.

Yasushi explains that DC power supplies 29 and 30 are power sources for supplying an electrical potential difference higher than the output voltage.

A polysilicon resistor also shows linearity problems. When a mean voltage reaches a certain value, the resistor will start to exhibit nonlinear behavior. In this case, the ambient temperature has an effect on the resistance. In many technologies, only low resistive polysilicon is available, which is useful for integrated circuit applications with resistors that can have a range of a tenth of an Ohm to a few KOhms. First, when the mean voltage drop on the monocristalline grain reaches a certain value, the resistor starts to exhibit significant nonlinear behavior. This value $V_t$ is provided in accordance with the following equation:

$$V_t = \frac{K \cdot T}{q}$$

where K is the Boltsmann constant,
T is the absolute temperature, and
q is the charge,
so, for example, $V_t$=25 mV at room temperature. Accordingly, for example, doubling both W and L of the resistor body will not change the resistive value; however, the mean voltage across the single polysilicon grain would be divided by two and so, in this case, the linearity improves. Thus, the linearity of the resistor can be improved, but only at the expense of increasing the size of the resistor body on the integrated circuit.

A high ohmic polysilicon is isolated from the substrate by a thick field oxide, but it has a very low doping level. Also, a weak capacitive coupling occurs between the polysilicon and the substrate, thus causing further nonlinear behavior, since the capacitive coupling can deplete the resistor body or accumulate charge, thus changing the value of the resistance and introducing another variable.

It will be understood that metal resistors, although typically linear, have very low ohmic values (in the mOhm range) for integrated circuit applications.

Several approaches have been used to mitigate the foregoing problems. First, a more heavily doped diffusion may be used for the resistor body. Thus, the depleted region narrows and the same voltage may be applied. Accordingly, linearity improves, however the silicon area required is increased because more heavy doping lowers the current per square unit of area and so, the length of the resistor needs be increased to achieve the same resistive value.

The resistor may be divided into N modules, each module implemented as an isolated well. Such an approach may use N isolated wells, such that each well is biased by shorting a contact region of the well with the correct terminal (typically the higher voltage terminal) of the module.

FIG. 2a shows a resistor body 20 with the high voltage terminal 41 making contact with the more heavily doped contact region 23 of the resistor body 20 such that the high voltage terminal 41 is shorted to the contact 33 of the surrounding N-type conductivity epi layer 30. FIG. 2a also shows the insulation $SiO_2$ layer 50 and the second contact region 25 of the resistor body 20 to which the lower voltage terminal 43 is connected, and also shows the depleted region 29. The example shown in FIG. 2a shows that the N-type epi layer 30 surrounding the resistor body 20 is directly on top of a P-type substrate 39.

FIG. 2b shows a resistor body similar to that shown in FIG. 2a except that the resistor shown in FIG. 2b is comprised of several resistor modules 21 and 22 such that the low voltage contact region 25 of first resistor module 21 is connected to terminal 43 to which the more heavily doped contact region 23b of second resistor body 22 is connected and to which the N-type epi layer contact region 33b of the second module is also connected. Accordingly, resistor modules 21 and 22 are connected in series to form a single resistor 20.

Using such an approach, the mean voltage drop between the resistor body and the surrounding well is divided by the number of resistor modules, and thus, the resistor as a whole behaves more linearly. However, a much bigger silicon area is required to accommodate the resistor modules.

Using a polysilicon resistor, linearity may be improved by increasing both width and length, however, this obviously involves more area and more cost.

In addition, FIG. 5 shows that metal shield 61 of the polysilicon resistor may produce a weak capacitive coupling region 65 between metal shield 61 and resistor body 20, which tends to create an electrical variation that undercuts the linearity of the resistor.

FIG. 6a shows a metal shield connected to a resistor terminal above the body of the diffused resistor to isolate it from charge trapped in the passivation layer or in other portions of the package such that the shield has the same voltage as one terminal of the resistor body and is isolated by an insulation layer, such as an oxide from the resistor body. Such an arrangement can introduce non-linearity near the second terminal of the resistor body with the same effect as the polysilicon resistor shown in FIG. 5.

Accordingly, there is an unmet need for an integrated circuit with a resistor that avoids these and other problems.

SUMMARY OF THE INVENTION

An integrated circuit that includes a resistor module with improved linearity is disclosed. The resistor module includes a diffused resistor body of a first conductivity type; a first terminal and a second terminal, each making direct electrical contact with the diffused resistor body at a first contact region and a second contact region, respectively; a doped well of a second conductivity type substantially surrounding the diffused resistor body on all but one major surface of the diffused resistor body, the doped well having a third contact region positioned on the doped well adjacent the first end of the diffused resistor body and a fourth contact region positioned on the doped well adjacent to the second end of the diffused resistor body; a first amplifier electrically connected to the first terminal and to the third contact region; and a second amplifier electrically connected to the second terminal and to the fourth contact region, wherein the first amplifier and the second amplifier are connected for power supply only to the first terminal and second terminal, respectively.

In such an integrated circuit the first amplifier may have an input to which the first terminal is connected and an output to which the third contact region is connected, and the second amplifier may have an input to which the second terminal is connected and an output to which the fourth contact region is connected.

The first and second amplifiers may be unity gain buffer amplifiers, or inverting opamps (operational amplifiers).

The first contact region and the second contact region may include more heavily doped areas than the remaining portions of the diffused resistor body, and the first contact region may connect ohmically with the first terminal and the second contact region may make ohmic connection with the second terminal. The third and fourth contact regions may also be more heavily doped than the remaining portions of the doped well.

The integrated circuit may further include an insulation layer positioned above the diffused resistor body, and several metal shields positioned above the insulation layer, each shield having at least one ohmic connection with the doped well. These conducting shields may be made of metal.

Further, the ohmic connection of each shield may be positioned on a portion of the doped well directly underneath each shield. Also, the shields may include a first row of shields positioned at a first level and a second row of shields positioned at a second level higher the first level. For example, the ohmic connection of each shield of the first row may be on a first side of the doped well, and the ohmic connection of each shield of the second row may be on a second side of the doped well, the first and second sides of the doped well being separated by a width of the diffused resistor body, and the shields of the first row may alternate with the shields of the second row along the length of the diffused resistor body. Also, the second row of shields may overlap, at least in part, the first row of shields in covering a top surface of the integrated circuit.

Other features and advantages of the present invention will become apparent from the following description of the invention referring to the accompanying Drawings.

BRIEF DESCRIPTION OF THE DRAWING(S)

The invention will now be described in greater detail in the following detailed description with reference to the Drawings in which:

FIG. 2a is a schematic illustration of a resistor body and a reverse biased well surrounding the resistor body;

FIG. 2b is a schematic illustration of the resistor separated into several isolated resistor modules with reverse biased wells surrounding each resistor module;

DETAILED DESCRIPTION OF PREFERRED EMBODIMENTS OF THE INVENTION

Figure 1:
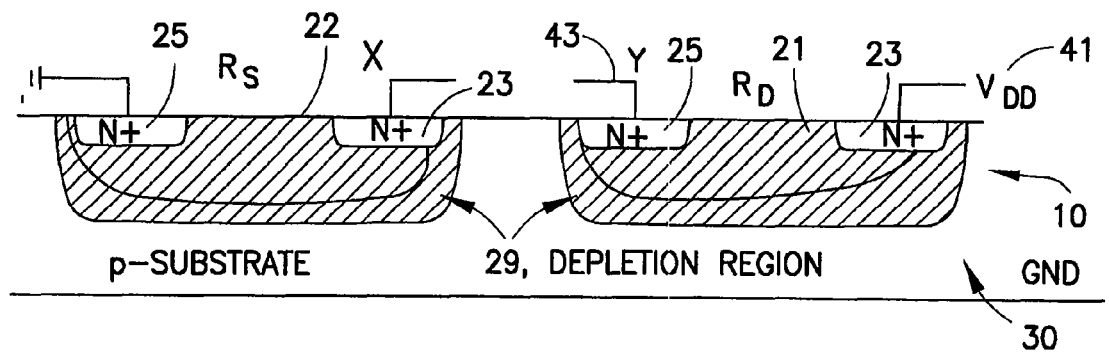
FIG. 1 is a schematic illustration of a resistor comprised of several resistor modules on an integrated circuit.
Figure 3:
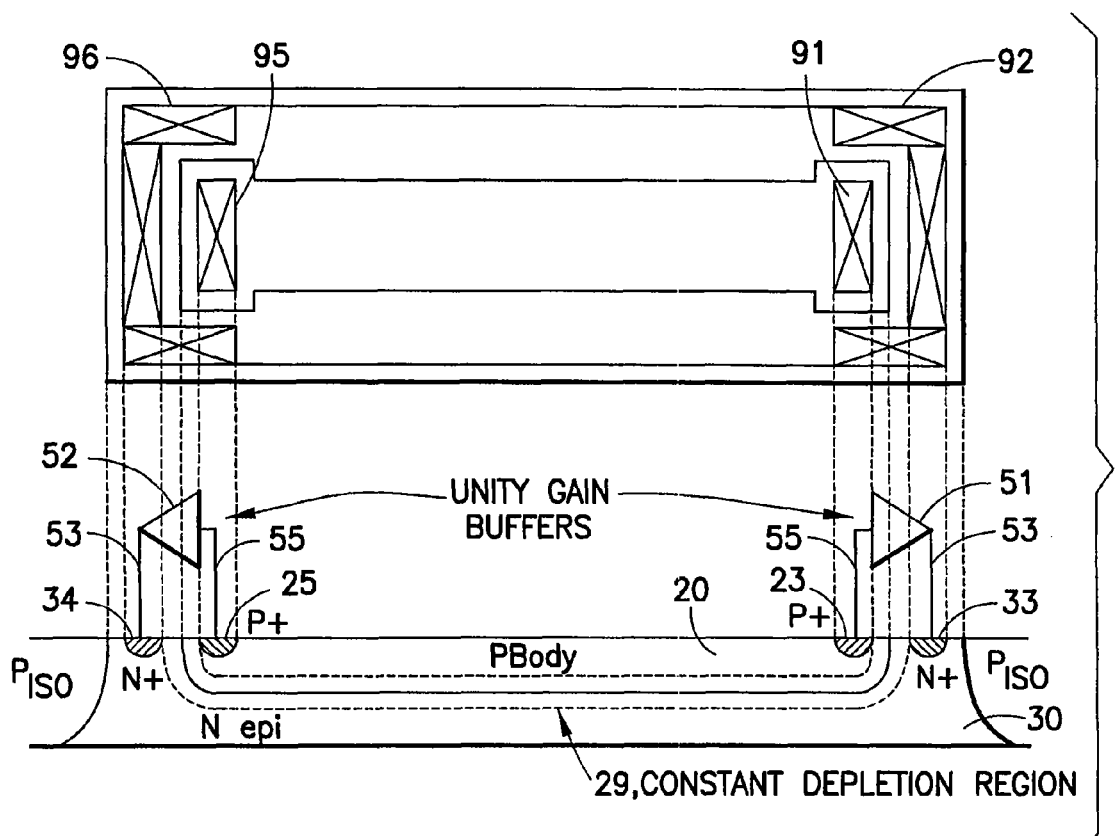
FIG. 3 is a schematic illustration of a portion of an integrated circuit with a resistor body and a surrounding well biased using two or more amplifiers or unity buffers, according to an aspect of the present invention.

FIG. 3 shows a portion of an integrated circuit in accordance with an embodiment of the present invention with a resistor body 20 with contact regions 23 and 25 to which amplifiers 51 and 52, respectively, are connected as inputs. Outputs of the amplifiers 51 and 52 are connected to the contact regions 33 and 34, respectively, of the N-type epi layer well 30 that surrounds the resistor body 20. The amplifiers 51 and 52 may be unity buffer amplifiers or inverting opamps as shown in FIG. 4, for example.

Figure 4:
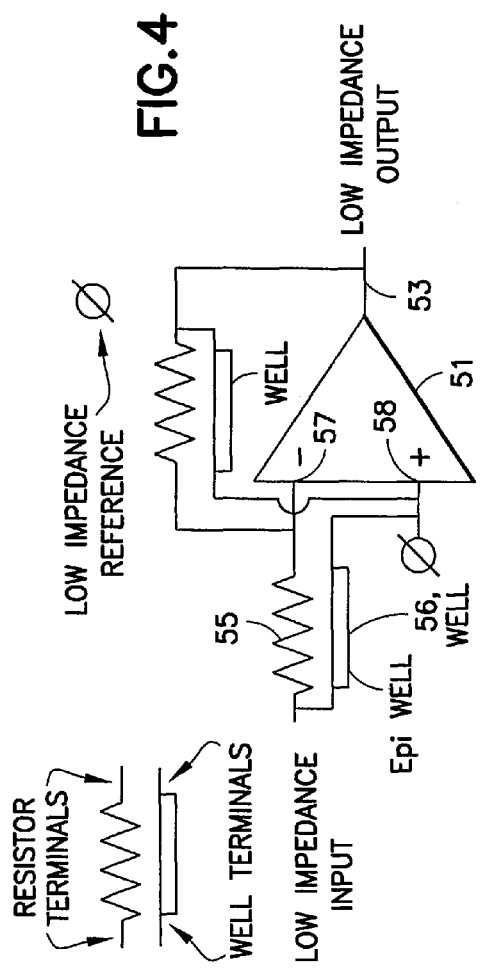
FIG. 4 is a schematic illustration of the amplifier, according to an aspect of the present invention.

FIG. 4 shows as an exemplary embodiment the amplifier 51 with an input 57 that is a resistor terminal 55 and a second input 58 connected to the well 30 and an output 53 connected to the well 30. Thus, the well 30 around each portion of the resistor body 20 is biased to reduce the depletion layer to the zero biasing condition all along or along most of the resistor-well interface, or PN junction. Using two buffer amplifiers, two sides of the well are biased with the same voltage as the terminals of the resistor, thus, the voltage drop across the resistor body and well is near zero at all points. As a result, depletion region modulation is avoided and the resistor operates in a substantially linear manner.

To reduce the area required for two buffer amplifiers, a simple inverting amplifier or opamp may be used, as shown in FIG. 4. FIG. 4 shows a low impedance input and a low impedance reference voltage provided to the amplifier, the amplifier itself providing a low impedance output. Accordingly, as shown in FIG. 4, no extra buffer amplifiers are necessary to provide the substantially linear operation discussed above. It will be understood that other amplifiers may be used without departing from the spirit of the present invention, and that the buffer amplifier and the opamp are provided only as illustrative examples of some of the circuits that accomplish the aims of the present invention.

For applications requiring high frequency signals, when the voltage across the resistor may change very rapidly. The well surrounding the resistor body may take time to exactly follow the voltage of the resistor body because the well typically has a higher resistance and higher capacitive than the resistor body. Thus the RC time constant of the well is higher and a higher frequency signal may result in distortion and lead to non-linear operation.

FIG. 3 also shows a top view of the contacts of the resistor in the integrated circuit. Contacts 91 and 95 represent a top view of the right and left resistor body contact regions 23 and 25, respectively, discussed above, contacts 92 and 96 being a top view of contacts 33 and 34, respectively, of well 30.

Figure 5:
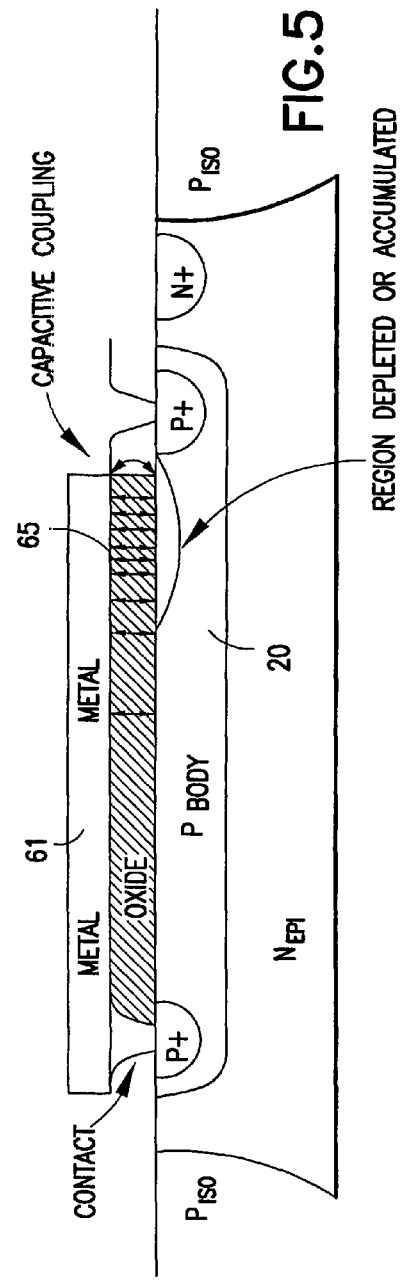
FIG. 5 shows a metal shield on top of the resistor body with capacitive coupling between the metal shield and the resistor body.

It is known that a metal shield connected to the resistor terminal may be placed above the diffused resistor body isolated by an insulation layer, such that the metal shield isolates the diffused resistor body from charges trapped in the passivation layer, or in the package. However, the metal shield can introduce non-linearity to the resistor because of the effect of capacitive coupling near the area of the resistor at the second terminal of the resistor body (the terminal not ohmically connected to the metal shield). See, for example, FIG. 5, which shows the capacitive coupling between the resistor body 20 and the metal shield 61.

Figure 6A:
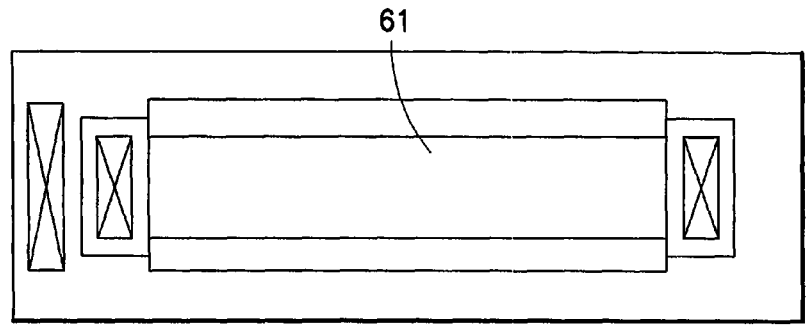
FIG. 6a is a schematic illustration of a top view of the metal shield over the resistor body.
Figure 6B:
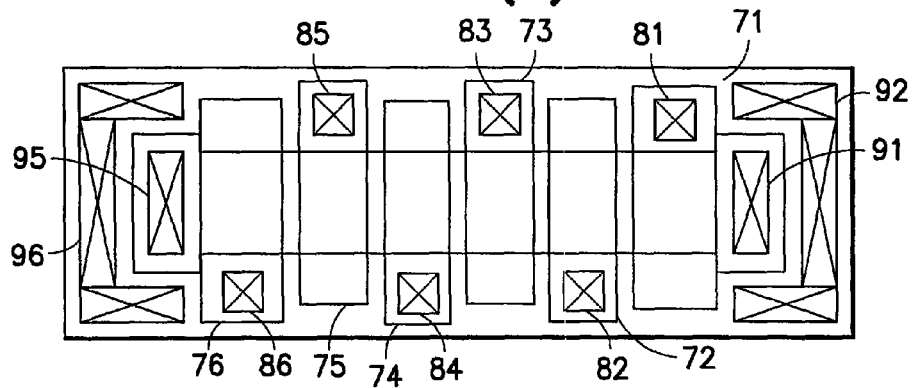
FIG. 6b is a schematic illustration of a top view of a series of metal or conducting shields disposed in a layer above the resistor body, each of the shields connected to the resistor body below, according to an aspect of the present invention.

According to an aspect of applicant's invention shown in FIG. 6a, several metal shields 71, 72, 73, 74, 75 and 76 are used instead of a single metal shield 61, such that each of the metal shields 71, 72, 73, 74, 75 and 76 is connected to the well 30 via an electrical connection 81, 82, 83, 84, 85 and 86, respectively. FIG. 6b shows that the first metal shield 71 is connected via electrical connection 81, positioned on one side of the resistor body 20, while the adjacent metal shield 72 is connected to the resistor body via connection 82 to the well 30 on the other side of the resistor body 20. Similarly, metal shields 83 and 84 and metal shields 85 and 86 are alternatingly connected to the well 30 at either side of the resistor body 20. Although six metal shields are shown in FIG. 6b, it will be understood that more or fewer of such metal shields may be deployed depending on the length of the resistor body and the width of the metal shields. As a result, undesirable capacitive coupling between resistor body 20 and metal shield 61 may be substantially eliminated or greatly reduced.

Figure 6C:
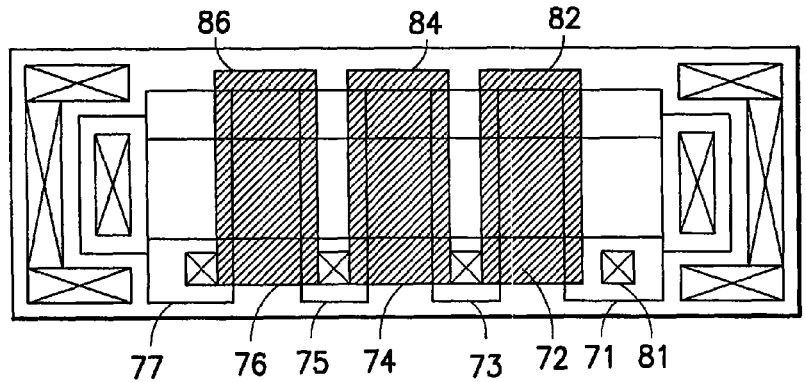
FIG. 6c is a schematic illustration of the metal shields configured in two layers above the resistor body, according to another aspect of the present invention.
Figure 7:
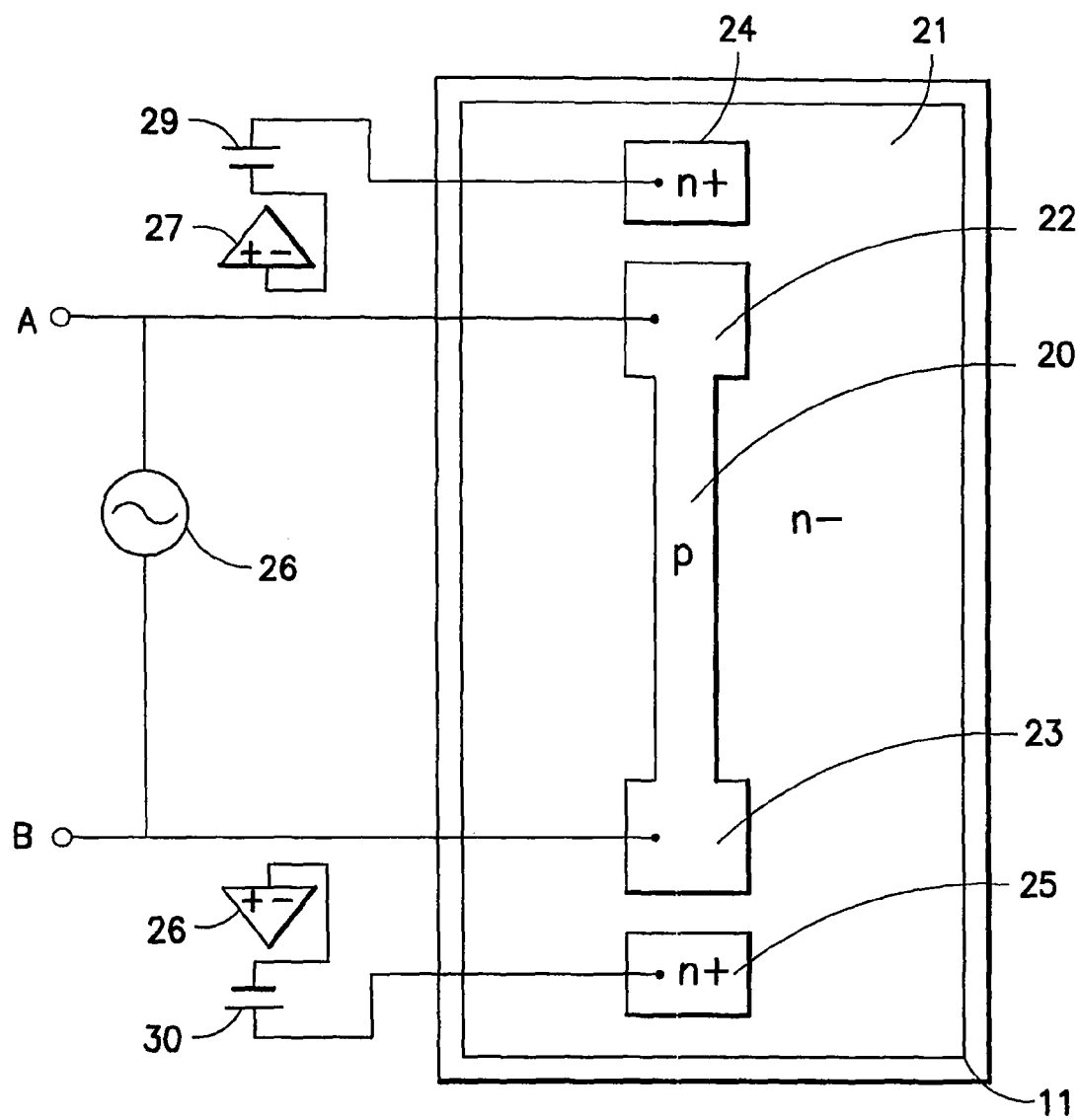
FIG. 7 is a schematic illustration of an integrated circuit resistor according to the prior art.

FIG. 6c shows a further embodiment of the present invention in which the metal shields are positioned in one of two rows, or layers, such that a first metal shield 71 connected to well 30 via connection 81 on a first side of resistor body 20 is positioned in the same row as metal shields 73, 75 and 77. On a higher row, or level, metal shields 72, 74 and 76 are positioned such that metal shields of the upper level alternate with metal shields of the lower level along the length of resistor body 20.

Also, FIG. 6c shows that metal shields of the upper level 72, 74 and 76 are connected via connections 82, 84 and 86, respectively, to well 30 on the second side of the resistor body while metal shields 71, 73, 75 and 77 are connected to well 30 on the first side of resistor body 20. However, it will be understood that not all metal shields of a layer need to be connected on the same side, or in an alternating fashion. Also, the metal shields shown in FIGS. 6b and 6c may be comprised of conductive materials other than metal. In addition, the shields may be made of more than one metal or of more than one conductive material. Further, the metal shields of the upper layer shown in FIG. 6c, for example, may be comprised of materials different from the materials of the lower layer shields. The embodiment shown in FIG. 6c may also include overlapping shields which provide more effective shielding while simultaneously electrically connecting the shields to well 30 to avoid the problems of undesirable capacitive coupling between resistor body 20 and metal shield 61 discussed above.

Although the present invention has been described in relation to particular embodiments thereof, many other variations and modifications and other uses will become apparent to those skilled in the art. Therefore, the present invention should be limited not by the specific disclosure herein, but only by the appended claims.

What is claimed is:

1. An integrated circuit comprising:
   a resistor body of a first conductivity type;
   a first terminal and a second terminal positioned away from the first terminal, each of the first terminal and the second terminal making direct electrical contact with the resistor body at a first contact region and a second contact region, respectively, of the resistor body, the first contact region being positioned at a first end of the resistor body and the second contact region being positioned at a second end of the resistor body opposite the first end;

a doped well of a second conductivity type substantially surrounding the resistor body on all but one major surface of the resistor body, the doped well having a third contact region positioned on the doped well adjacent the first end of the resistor body and a fourth contact region positioned on the doped well adjacent to the second end of the resistor body;

a first amplifier electrically connected to the first terminal and to the third contact region, an output of the first amplifier electrically connected to the doped well without an intervening voltage source; and a second amplifier electrically connected to the second terminal and to the fourth contact region, an output of the second amplifier electrically connected to the doped well without an intervening voltage source, wherein the first amplifier and the second amplifier are connected for power supply only to the first terminal and second terminal, respectively;

wherein said third contact region and said fourth contact region are biased by said first amplifier and said second amplifier, respectively, with a biasing voltage that is substantially equal to a voltage at said first and second terminals.

2. The integrated circuit of claim 1, wherein the first amplifier has an input to which the first terminal is connected and an output to which the third contact region is connected, and the second amplifier has an input to which the second terminal is connected and an output to which the fourth contact region is connected.

3. The integrated circuit of claim 1, wherein the first amplifier and the second amplifier are unity gain buffer amplifiers.

4. The integrated circuit of claim 1, wherein the first amplifier and the second amplifier are inverting opamps.

5. The integrated circuit of claim 1, wherein the first contact region and the second contact region comprise heavily doped areas that are more heavily doped than remaining portions of the resistor body, and the first contact region makes a direct ohmic connection with the first terminal and the second contact region makes a direct ohmic connection with the second terminal, and wherein the third contact region and fourth contact region comprise additional heavily doped areas that are more heavily doped than remaining portions of the doped well.

6. The integrated circuit of claim 1, further comprising:
an insulation layer positioned above the resistor body; and
a plurality of conducting shields positioned above the insulation layer, each shield of the plurality of conducting shields having at least one ohmic connection with the doped well.

7. The integrated circuit of claim 6, wherein the plurality of conducting shields are comprised of metal.

8. The integrated circuit of claim 6, wherein the at least one ohmic connection of each shield of the plurality of shields is positioned on a portion of the doped well directly underneath each shield.

9. The integrated circuit of claim 8, wherein the plurality of shields comprises a first row of shields positioned at a first level and a second row of shields positioned at a second level, the second level being higher than the first level.

10. The integrated circuit of claim 9, wherein the at least one ohmic connection of each shield of the first row is on a first side of the doped well, and the at least one ohmic connection of each shield of the second row is on a second side of the doped well, the first and second sides of the doped well being separated by a width of the resistor body, and wherein the shields of the first row alternate with the shields of the second row along the length of the resistor body.

11. The integrated circuit of claim 9, wherein the second row of shields at least in part overlaps the first row of shields in covering a top surface of the integrated circuit.

12. An integrated circuit comprising:
a resistor body of a first conductivity type;
a doped well of a second conductivity type, said doped well substantially surrounding said resistor body on all but one major surface;
a first amplifier electrically connected to a first contact region of said doped well and further connected to a first end of said resistor body, an output of the first amplifier electrically connected to the doped well without an intervening voltage source;
a second amplifier electrically connected to a second contact region of said doped well and further connected to a second end of said resistor body, an output of the second amplifier connected to the doped well without an intervening voltage source;
wherein said first contact region of said doped well and said second contact region of said doped well are biased by said first amplifier and said second amplifier, respectively, with a biasing voltage that is substantially equal to a voltage at said first and second ends of said resistor body.

13. The integrated circuit of claim 12, further comprising:
a first terminal in direct electrical contact with said first end of said resistor body, wherein said first terminal supplies electrical power to said first amplifier;
a second terminal in direct electrical contact with said second end of said resistor body wherein said second terminal supplies electrical power to said second amplifier.

14. The integrated circuit of claim 12, wherein the first amplifier and the second amplifier are unity gain buffer amplifiers.

15. The integrated circuit of claim 12, wherein the first amplifier and the second amplifier are inverting opamps.

16. The integrated circuit of claim 12, further comprising:
an insulation layer positioned above the resistor body; and
a plurality of conducting shields positioned above the insulation layer, each shield of the plurality of conducting shields having at least one ohmic connection with the doped well.

17. The integrated circuit of claim 16, wherein the plurality of conducting shields substantially comprise a metal.

\* \* \* \* \*

UNITED STATES PATENT AND TRADEMARK OFFICE
CERTIFICATE OF CORRECTION

PATENT NO. : 8,384,157 B2  
APPLICATION NO. : 11/746949  
DATED : February 26, 2013  
INVENTOR(S) : Sergio Morini Page 1 of 1

It is certified that error appears in the above-identified patent and that said Letters Patent is hereby corrected as shown below:

On the Title page of the patent, item (60),

Related U.S. Application Data

Should list:

--Provisional application No. 60/779,301, filed on May 10, 2006.--

Signed and Sealed this  
Twenty-ninth Day of October, 2013

Teresa Stanek Rea  
*Deputy Director of the United States Patent and Trademark Office*